US009209097B2

(12) United States Patent
Endo

(10) Patent No.: US 9,209,097 B2
(45) Date of Patent: Dec. 8, 2015

(54) SUBSTRATE BONDING METHOD AND SUBSTRATE BONDING APPARATUS

(71) Applicant: KABUSHIKI KAISHA TOSHIBA, Minato-ku, Tokyo (JP)

(72) Inventor: Mitsuyoshi Endo, Yamato (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/198,339

(22) Filed: Mar. 5, 2014

(65) Prior Publication Data

US 2015/0140689 A1    May 21, 2015

(30) Foreign Application Priority Data

Nov. 18, 2013  (JP) ................. 2013-238061

(51) Int. Cl.
| H01L 21/76 | (2006.01) |
| H01L 21/30 | (2006.01) |
| H01L 21/46 | (2006.01) |
| H01L 21/66 | (2006.01) |
| H01L 21/67 | (2006.01) |

(52) U.S. Cl.
CPC .......... *H01L 22/26* (2013.01); *H01L 21/67092* (2013.01); *H01L 21/67109* (2013.01)

(58) Field of Classification Search
CPC .............. H01L 21/67248; H01L 24/80; H01L 21/2007; H01L 2224/83894
USPC .......... 438/406, 455, 457, 715; 257/E21.122, 257/E21.214, E21.567, E21.6, E21.601
See application file for complete search history.

(56) References Cited

U.S. PATENT DOCUMENTS

| 2006/0292822 | A1* | 12/2006 | Xie ................................ 438/455 |
| 2011/0092049 | A1* | 4/2011 | Chen et al. .................... 438/455 |
| 2012/0180928 | A1* | 7/2012 | Bruck ....................... B23K 1/19 156/64 |
| 2012/0247645 | A1* | 10/2012 | Tsutsumi et al. ............... 156/64 |
| 2013/0241061 | A1* | 9/2013 | Chinone ........... H01L 21/02425 257/741 |
| 2013/0256824 | A1* | 10/2013 | Mizuta et al. .................. 257/459 |
| 2013/0327463 | A1* | 12/2013 | Kitahara et al. ................ 156/64 |

FOREIGN PATENT DOCUMENTS

| JP | 2011-114278 | A | 6/2011 |
| JP | 2011-216832 | A | 10/2011 |
| JP | 2011-216833 | A | 10/2011 |
| JP | 2012-004585 | A | 1/2012 |
| JP | 4867373 | B2 | 2/2012 |
| JP | 2012-231063 | A | 11/2012 |

* cited by examiner

*Primary Examiner* — Mohsen Ahmadi
(74) *Attorney, Agent, or Firm* — Holtz, Holtz, Goodman & Chick PC

(57) ABSTRACT

According to one embodiment, there is provided a substrate bonding method. The substrate bonding method includes disposing a first substrate and a second substrate to face each other. The substrate bonding method includes controlling the first substrate and the second substrate to have a temperature difference. The substrate bonding method includes, in a state where the first substrate and the second substrate are controlled to have the temperature difference, bonding the first substrate to the second substrate by bringing the first substrate into contact with the second substrate while deforming the first substrate so that a central portion of the first substrate is projected toward the second substrate. The central portion of the first substrate is on an inner side of a peripheral portion of the first substrate.

6 Claims, 8 Drawing Sheets

SUBSTRATE BONDING METHOD AND SUBSTRATE BONDING APPARATUS

CROSS-REFERENCE TO RELATED APPLICATIONS

This application is based upon and claims the benefit of priority from Japanese Patent Application No. 2013-238061, filed on Nov. 18, 2013; the entire contents of which are incorporated herein by reference.

FIELD

Embodiments described herein relate generally to a substrate bonding method and a substrate bonding apparatus.

BACKGROUND

For obtaining a stack-type semiconductor device, in some cases, semiconductor substrates are bonded to each other without cutting or dividing the semiconductor substrates into chips. On this occasion, improvement of the positioning accuracy for the bonding between the plural semiconductor substrates has been desired.

DETAILED DESCRIPTION

Figure 1:
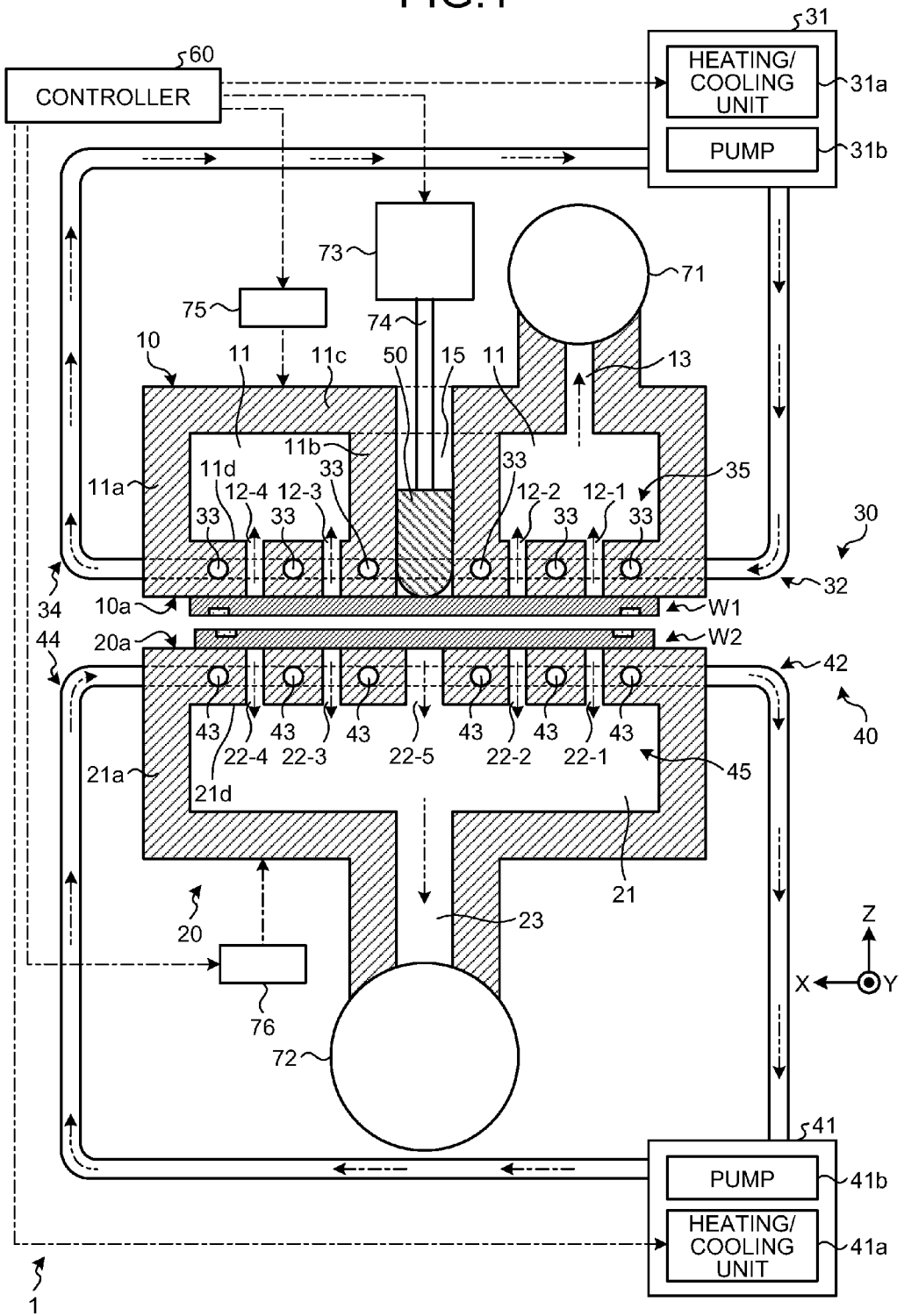
FIG. 1 illustrates a structure of a substrate bonding apparatus according to an embodiment.

In general, according to one embodiment, there is provided a substrate bonding method. The substrate bonding method includes disposing a first substrate and a second substrate to face each other. The substrate bonding method includes controlling the first substrate and the second substrate to have a temperature difference. The substrate bonding method includes, in a state where the first substrate and the second substrate are controlled to have the temperature difference, bonding the first substrate to the second substrate by bringing the first substrate into contact with the second substrate while deforming the first substrate so that a central portion of the first substrate is projected toward the second substrate. The central portion of the first substrate is on an inner side of a peripheral portion of the first substrate.

Exemplary embodiments of a substrate bonding method and a substrate bonding apparatus will be explained below in detail with reference to the accompanying drawings. The present invention is not limited to the following embodiments.

Embodiment

A substrate bonding method according to an embodiment is described.

For obtaining a stack-type semiconductor device, a plurality of chips needs to be stacked in a packaging process for a semiconductor device. In this process, two semiconductor substrates are bonded to each other by performing a step of bonding the two semiconductor substrates to each other at least once, and the bonded body is cut or divided, thereby separating the semiconductor device into chips. Thus, the step of stacking can be performed collectively for the plural semiconductor devices, and as compared with the case of stacking the chips per package, the process of manufacturing the semiconductor devices can be simplified and the manufacturing cost can be reduced.

The following method is given as one method of bonding two semiconductor substrates. For example, the surface of each of the two semiconductor substrates is subjected to hydrophilic treatment, thereby terminating the surface with a hydroxyl group. Then, the two semiconductor substrates are disposed to face each other, and one point on one substrate is pressed. A bonding start point of the one substrate with respect to the other substrate is formed in a manner that the one substrate is brought into contact with the other substrate while the one substrate is deformed so that the central portion of the one substrate, which is on the inner side of the peripheral portion of the one substrate, is projected toward the other substrate. Then, the bonding interface expands spontaneously toward the outer periphery. In other words, upon the formation of the bonding start point of hydrogen bond between the hydroxyl groups across the surfaces of the two semiconductor substrates, the bonding interface expands isotropically from the bonding start point toward the outer periphery. In this specification, the method of bonding the two semiconductor substrates by the expansion of the bonding interface is referred to as an expansion boding method. The semiconductor substrate may be referred to as a substrate simply.

In this method (expansion bonding method), the two semiconductor substrates are bonded through hydrogen bond, and an annealing process is performed at high temperature after the bonding, thereby eliminating water from the two hydroxyl groups that are bonded with hydrogen. Thus, the hydrogen bond is turned into covalent bond, so that the bonding reaction is completed. Since the position where the substrates are bonded to each other is decided at the time of bonding before the high-temperature annealing, relatively high positioning accuracy is required at the bonding before the high-temperature annealing.

Figure 3:
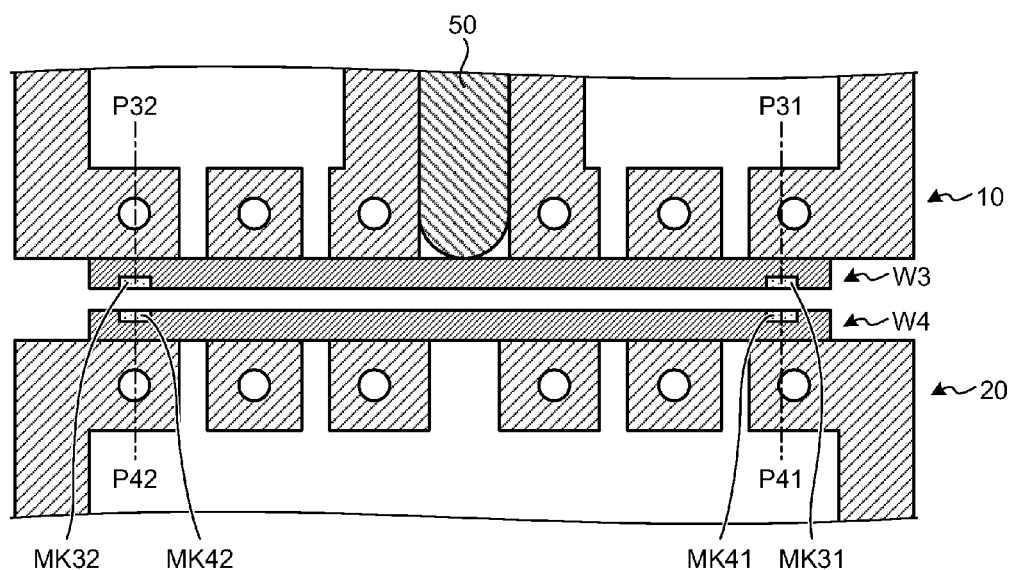
FIG. 3 is a diagram of setting the condition according to an embodiment (in the case where the upper substrate is misaligned with the lower substrate toward the center of the lower substrate)
Figure 4:
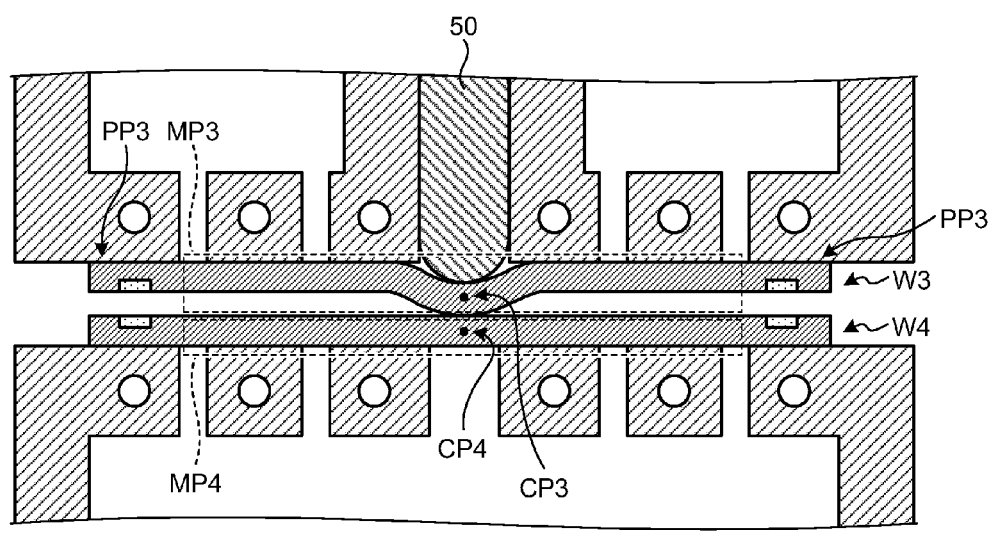
FIG. 4 is a diagram of setting the condition according to an embodiment (in the case where the upper substrate is misaligned with the lower substrate toward the center of the lower substrate)
Figure 5:
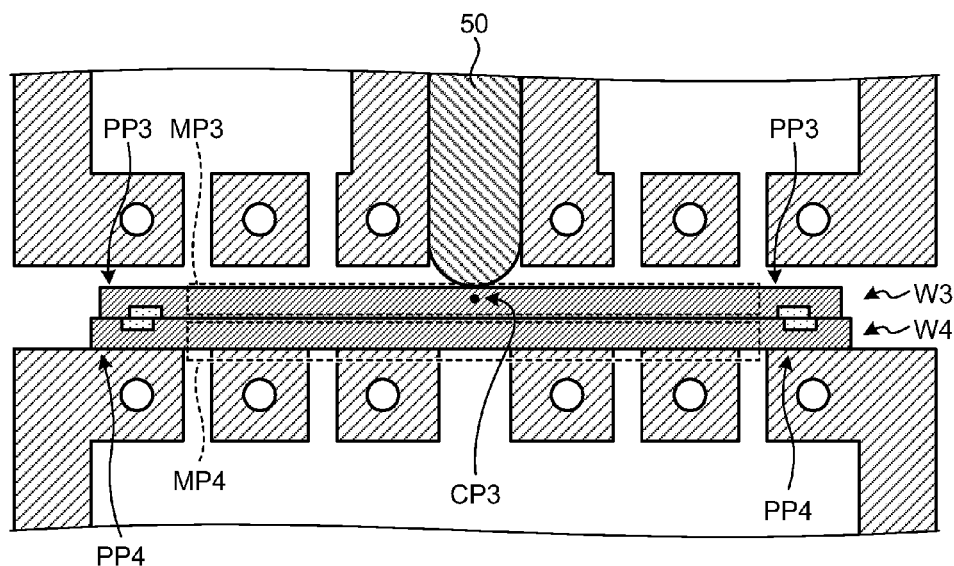
FIG. 5 is a diagram of setting the condition according to an embodiment (in the case where the upper substrate is misaligned with the lower substrate toward the center of the lower substrate)

This method is described more specifically with reference to FIG. 3 to FIG. 5 and FIG. 11. As illustrated in FIG. 3, an upper substrate W3 and a lower substrate W4 are sucked on a suction stage 10 and a suction stage 20, respectively. In the initial state, the substrates have equal size and are flat. In this state, alignment marks MK31 and MK32 formed at reference positions P31 and P32 on the upper substrate W3 and alignment marks MK41 and MK42 formed at reference positions P41 and P42 on the lower substrate W4 are photographed with an IR microscope. With the use of the IR transmission images, the suction stages 10 and 20 are moved relative to each other so that the alignment marks on the both substrates W3 and W4 are aligned. Thus, the reference positions of the substrates W3 and W4 can be aligned with each other, thereby aligning the substrates W3 and W4. Next, in a state that the reference positions P31 and P32 of the upper substrate W3 and the reference positions P41 and P42 of the lower substrate W4 are aligned with each other, a central portion MP3 of the upper substrate W3 on a non-bonded surface side (for example, portion near a center CP3) is mechanically pressed with a pressing member (for example, a pin) 50 as illustrated in FIG. 4. Thus, the substrate W3 is deformed so that the central portion MP3 on the bonded surface side of the upper substrate W3 is projected toward the lower substrate W4, so that the upper and lower substrates W3 and W4 are brought into contact with each other at the central portions (for example, portions near the centers CP3 and CP4) MP3 and MP4. In this state, the bonding reaction occurs at the central portions MP3 and MP4 of the substrates W3 and W4. Next, as illustrated in FIG. 5, the suction of the upper substrate W3 is stopped sequentially from the central side, thereby expanding the bonding reaction from the central portion MP3 toward a peripheral portion PP3 of the substrate W3. In other words, the bonding interface expands from the bonding start point between the central portions MP3 and MP4 toward the peripheral portion PP3 between the two substrates W3 and W4.

Figure 11:
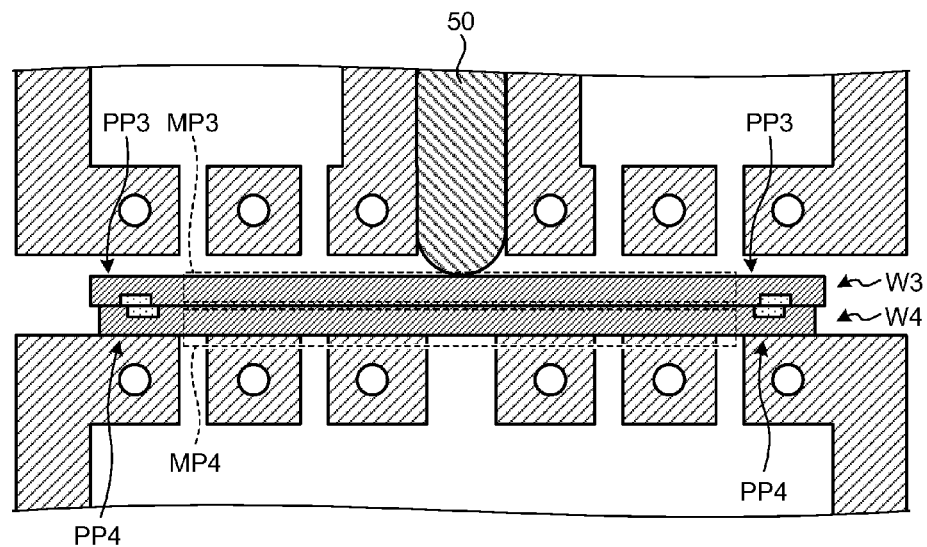
FIG. 11 is a diagram of setting the condition according to an embodiment (in the case where the upper substrate is misaligned with the lower substrate toward the outside of the lower substrate)

It is assumed that in this expansion bonding method, the two substrates W3 and W4 are bonded with the substrates W3 and W4 having the room temperature. In this case, even though the reference positions P31 and P32 of the upper substrate W3 are aligned with the reference positions P41 and P42 of the lower substrate W4 in the initial state, the projection of the central portion MP3 of the upper substrate W3 is highly likely to result in that the upper substrate W3 and the lower substrate W4 are bonded in a state where the reference positions P31 and P32 are misaligned with the reference positions P41 and P42. For example, as illustrated in FIG. 4, the projection of the central portion MP3 of the upper substrate W3 causes the entire substrate W3 to be pulled toward the central portion CP3, which may result in that, microscopically, the suction position of the outer periphery of the substrate W3 is misaligned toward the central portion CP3 relative to the substrate W4 as illustrated in FIG. 5. Alternatively, as illustrated in FIG. 4, the projection of the central portion MP3 of the upper substrate W3 causes the entire substrate W3 to be pulled outward, which may result in that, microscopically, the suction position of the outer periphery of the substrate W3 is misaligned outward relative to the substrate W4 as illustrated in FIG. 11. For example, if the diameter of the substrate is 300 mm and the amount of projection is 100 μm, the amount of misalignment of the bonding position at the substrate periphery may be 1 μm or more on one side. Note that the amount and the direction of the misalignment of the bonding position are affected by various factors including the shape, amount of pressing, material, and thickness of the substrate, the position, strength, and timing of stopping the suction, and the degree of projection of the substrate (radius of curvature of the projection in a sectional view).

If the two substrates are bonded to each other in the state where the reference position of the upper substrate is misaligned with the reference position of the lower substrate, the positioning accuracy for the bonding between the two semiconductor substrates is easily deteriorated. The deterioration in positioning accuracy for the bonding between the two semiconductor substrates may result in the deterioration in manufacturing yield of packages of semiconductor devices obtained by cutting and dividing the bonded plural semiconductor substrates. For example, in the case of conducting electricity by the contact between pad electrodes of the upper and lower chips stacked in the package of the semiconductor device, the electricity may not conduct between the upper and lower chips.

In view of this, this embodiment aims to cancel the misalignment of the reference positions of the two substrates due to the deformation of the substrate at the bonding, by bonding the two substrates with the intentional temperature differences between the two substrates in the expansion bonding method.

Specifically, the two substrates are bonded to each other using a substrate bonding apparatus 1 as illustrated in FIG. 1. FIG. 1 illustrates a structure of the substrate bonding apparatus 1.

The substrate bonding apparatus 1 includes a suction stage (first suction stage) 10, a suction stage (second suction stage) 20, a temperature control unit 30, a temperature control unit 40, a pressing member 50, and a controller 60.

The suction stage 10 is provided to face the suction stage 20 during the usage, and sucks a substrate (for example, the substrate W1) on an opposite surface 10a facing the suction stage 20. The suction stage 10 sucks to vacuum the substrate on the opposite surface 10a. The suction stage 10 sucks to vacuum the substrate on the opposite surface 10a so as to face the substrate sucked on the suction stage 20.

The suction stage 10 includes, for example, a vacuum chamber 11, a plurality of suction holes 12-1 to 12-4, an exhaust pipe 13, an opening/closing mechanism 14 (not shown), and a penetration hole 15. The exhaust pipe 13 communicates with the vacuum chamber 11 and is connected to an exhaust device 71. The exhaust device 71 evacuates the vacuum chamber 11 via the exhaust pipe 13.

The vacuum chamber 11 has a space with a donut-like shape surrounded by, for example, an external wall 11a, an internal wall 11b, an upper wall 11c, and a bottom wall 11d. For example, the external wall 11a and the internal wall 11b constitute an approximately cylindrical shape sharing the center. The upper wall 11c and the bottom wall 11d have the donut-like shape in plan view. The penetration hole 15 penetrates through the suction stage 10 in a direction approximately vertical to the opposite surface 10a. The penetration hole 15 is surrounded by the internal wall 11b to be isolated from the vacuum chamber 11.

The plurality of suction holes 12-1 to 12-4 is provided for the opposite surface 10a so as to penetrate through the bottom wall 11d, and communicates with the vacuum chamber 11 from the space near the opposite surface 10a. The suction holes 12-1 to 12-4 are provided two-dimensionally in plan view, which is not shown, and provided for, for example, the opposite surface 10a in a concentric manner. The opening/closing mechanism 14 sequentially closes the suction holes 12-1 to 12-4 from the central side, and sequentially opens the suction holes 12-1 to 12-4 from the central side. The opening/closing mechanism 14 may have, for example, a plurality of wings and a plurality of rails provided obliquely radially from the central side on the bottom wall of the vacuum chamber 11. The opening/closing mechanism 14 may be configured to sequentially close the suction holes 12-1 to 12-4 from the central side by having the wings run along the rails to vary the outer diameter of the wings. The suction stage 10 sucks to vacuum the substrate via the suction holes opened by the opening/closing mechanism 14.

Note that the suction stage 10 may suck the substrate electrostatically instead of sucking the substrate to vacuum.

The suction stage 20 is provided to face the suction stage 10 during the usage, and sucks a substrate (for example, the substrate W2) on an opposite surface 20a facing the suction stage 10. The suction stage 20 sucks to vacuum the substrate on the opposite surface 20a. The suction stage 20 sucks to vacuum the substrate on the opposite surface 20a so as to face the substrate sucked on the suction stage 10.

The suction stage 20 includes, for example, a vacuum chamber 21, a plurality of suction holes 22-1 to 22-5, an exhaust pipe 23, and an opening/closing mechanism 24 (not shown). The exhaust pipe 23 communicates with the vacuum chamber 21 and is connected to an exhaust device 72. The exhaust device 72 evacuates the vacuum chamber 21 via the exhaust pipe 23.

The vacuum chamber 21 has a space with a column-like shape surrounded by, for example, an external wall 21a, an upper wall 21c, and a bottom wall 21d. The external wall 21a has an approximately cylindrical shape. The upper wall 21c and the bottom wall 21d are circular in shape in plan view.

The plurality of suction holes 22-1 to 22-5 is provided for the opposite surface 20a so as to penetrate through the upper wall 21c, and communicates with the vacuum chamber 21 from the space near the opposite surface 20a. The suction holes 22-1 to 22-5 are provided two-dimensionally in plan view, which is not shown, and provided for, for example, the opposite surface 20a in a concentric manner. The opening/closing mechanism 24 closes the suction holes 22-1 to 22-5 collectively, and opens the suction holes 22-1 to 22-4 collectively. The suction stage 20 sucks the substrate to vacuum via the suction holes opened by the opening/closing mechanism 24.

The temperature control unit 30 controls the temperature of the substrate (for example, the substrate W1) sucked on the suction stage 10. The temperature control unit 30 is controlled by the controller 60 so that the temperature of the substrate sucked on the suction stage 10 reaches the target temperature.

The temperature control unit 30 controls the temperature of the substrate sucked on the opposite surface 10a by transmitting a cooling medium (first cooling medium) near the opposite surface 10a of the suction stage 10. The cooling medium may be, for example, liquid such as water or gas such as helium. The temperature control unit 30 includes, for example, a temperature control structure (first temperature control structure) 35, a cooling medium pipe 32, a cooling medium pipe 34, and a cooling medium control device 31. The cooling medium control device 31 has a heating/cooling unit 31a and a pump 31b.

The heating/cooling unit 31a is controlled by the controller 60 and heats or cools the cooling medium so that the temperature of the cooling medium reaches the target temperature. The heating/cooling unit 31a may heat or cool the cooling medium so that the temperature of the cooling medium reaches the target temperature by performing the feed-forward control using the experimentally predetermined parameters. Alternatively, the heating/cooling unit 31a may heat or cool the cooling medium so that the temperature of the cooling medium reaches the target temperature by performing feedback control while comparing the target temperature and the temperature of the cooling medium detected by a temperature sensor (not shown).

The pump 31b feeds the cooling medium in accordance with the control from the controller 60 so that the flow rate of the cooling medium passing through the suction stage 10 reaches the target flow rate. The pump 31b may feed the cooling medium so that the flow rate of the cooling medium reaches the target flow rate by performing the feed-forward control using the parameters obtained in advance from experiments. Alternatively, the pump 31b may feed the cooling medium so that the flow rate of the cooling medium reaches the target flow rate by performing the feedback control while comparing the target temperature and the temperature of the cooling medium detected by a temperature sensor (not shown).

The temperature control structure 35 is provided for the suction stage 10 so as to control the temperature near the opposite surface 10a of the suction stage 10. In other words, the temperature control structure 35 is provided for the suction stage 10 so as to control the temperature of the substrate sucked on the suction stage 10. The temperature control structure 35 has a cooling medium flow path 33. The cooling medium flow path 33 extends along the opposite surface 10a in the suction stage 10 avoiding the suction holes 12-1 to 12-4. The cooling medium flow path 33 extends along the opposite surface 10a near the opposite surface 10a. The cooling medium flow path 33 extends spirally to connect between the cooling medium pipes 32 and 34 when seen through from a direction perpendicular to the opposite surface 10a, though the diagram is not shown. The cooling medium pipe 32 guides the cooling medium fed from the cooling medium control device 31 to the cooling medium flow path 33. The cooling medium pipe 34 guides the cooling medium fed from the cooling medium flow path 33 back to the cooling medium control device 31.

On this occasion, the temperature of the cooling medium flowing in the cooling medium flow path 33 is controlled to reach the target temperature and the flow rate of the cooling medium is controlled to reach the target flow rate; therefore, the temperature of the substrate sucked on the suction stage 10 can be controlled to reach the target temperature. In other words, the temperature control unit 30 controls the temperature of the substrate sucked on the suction stage 10 via the temperature control structure 35 in accordance with the control from the controller 60.

The temperature control unit 40 controls the temperature of the substrate (for example, the substrate W2) sucked on the suction stage 20. The temperature control unit 40 controls the temperature of the substrate sucked on the suction stage 20 to reach the target temperature in accordance with the control from the controller 60.

The temperature control unit 40 controls the temperature of the substrate sucked on the opposite surface 20a by transmitting a cooling medium (second cooling medium) near the opposite surface 20a in the suction stage 20. The cooling medium may be, for example, liquid such as water or gas such as helium. The temperature control unit 40 includes, for example, a temperature control structure (second temperature control structure) 45, a cooling medium pipe 42, a cooling medium pipe 44, and a cooling medium control device 41. The cooling medium control device 41 has a heating/cooling unit 41a and a pump 41b.

The heating/cooling unit 41a is controlled by the controller 60 and heats or cools the cooling medium so that the temperature of the cooling medium reaches the target temperature. The heating/cooling unit 41a may heat or cool the cooling medium so that the temperature of the cooling medium reaches the target temperature by performing the feed-forward control using the experimentally predetermined parameters. Alternatively, the heating/cooling unit 41a may heat or cool the cooling medium so that the temperature of the cooling medium reaches the target temperature by performing feedback control while comparing the target temperature and the temperature of the cooling medium detected by a temperature sensor (not shown).

The pump 41b feeds the cooling medium in accordance with the control from the controller 60 so that the flow rate of the cooling medium passing through the suction stage 20 reaches the target flow rate. The pump 41b may feed the cooling medium so that the flow rate of the cooling medium reaches the target flow rate by performing the feed-forward control using the experimentally predetermined parameters. Alternatively, the pump 41b may feed the cooling medium so that the flow rate of the cooling medium reaches the target flow rate by performing the feedback control while comparing the target temperature and the temperature of the cooling medium detected by a temperature sensor (not shown).

The temperature control structure 45 is provided for the suction stage 20 so as to control the temperature near the opposite surface 20a of the suction stage 20. In other words, the temperature control structure 45 is provided for the suction stage 20 so as to control the temperature of the substrate sucked on the suction stage 20. The temperature control structure 45 has a cooling medium flow path 43. The cooling medium flow path 43 extends along the opposite surface 20a in the suction stage 20 avoiding the suction holes 22-1 to 22-5. The cooling medium flow path 43 extends along the opposite surface 20a near the opposite surface 20a. The cooling medium flow path 43 extends spirally to connect between the cooling medium pipes 42 and 44 when seen through from a direction perpendicular to the opposite surface 20a, though the diagram is not shown. The cooling medium pipe 42 guides the cooling medium fed from the cooling medium control device 41 to the cooling medium flow path 43. The cooling medium pipe 44 guides the cooling medium fed from the cooling medium flow path 43 back to the cooling medium control device 41.

On this occasion, the temperature of the cooling medium flowing in the cooling medium flow path 43 is controlled to reach the target temperature and the flow rate of the cooling medium is controlled to reach the target flow rate; therefore, the temperature of the substrate sucked on the suction stage 20 can be controlled to reach the target temperature. In other words, the temperature control unit 40 controls the temperature of the substrate sucked on the suction stage 20 via the temperature control structure 45 in accordance with the control from the controller 60.

The pressing member 50 moves via the penetration hole 15 in accordance with the control from the controller 60. For example, the pressing member 50 presses the sucked surface of the substrate (for example, the substrate W1) toward the suction stage 20 in a state that the substrate W1 is sucked on the suction stage 10 (see FIG. 8). Thus, the pressing member 50 deforms the substrate sucked on the suction stage 10 so that the substrate is projected toward the suction stage 20. The pressing member 50 can have the end thereof with a curved surface (for example, spherical surface) so that the stress applied to the substrate is dispersed.

The controller 60 controls the entire operation of each portion of the substrate bonding apparatus 1.

For example, the controller 60 drives the suction stage 10 via a driving device 75 and drives the suction stage 20 via a driving device 76. For example, the controller 60 receives from the IR microscope or the like, the photographed image (IR transmission image) including the alignment marks of the substrate sucked on the suction stage 10 and the alignment marks of the substrate sucked on the suction stage 20. Thus, the controller 60 drives the suction stages 10 and 20 relatively in an X-Y direction so that the alignment marks of the both substrates are aligned. The controller 60 may move the suction stages 10 and 20 relatively further in a Z direction.

For example, the controller 60 controls the temperature of the cooling medium passing through the suction stage 10 to reach the target temperature T1 via the temperature control unit 30, and controls the temperature of the cooling medium passing through the suction stage 20 to reach the target temperature T2 ($\neq$T1) via the temperature control unit 40. Thus, the controller 60 controls so that the substrate (for example, the substrate W1) sucked on the suction stage 10 and the substrate (for example, the substrate W2) sucked on the suction stage 20 have the temperature difference (=|T1−T2|).

Figure 7:
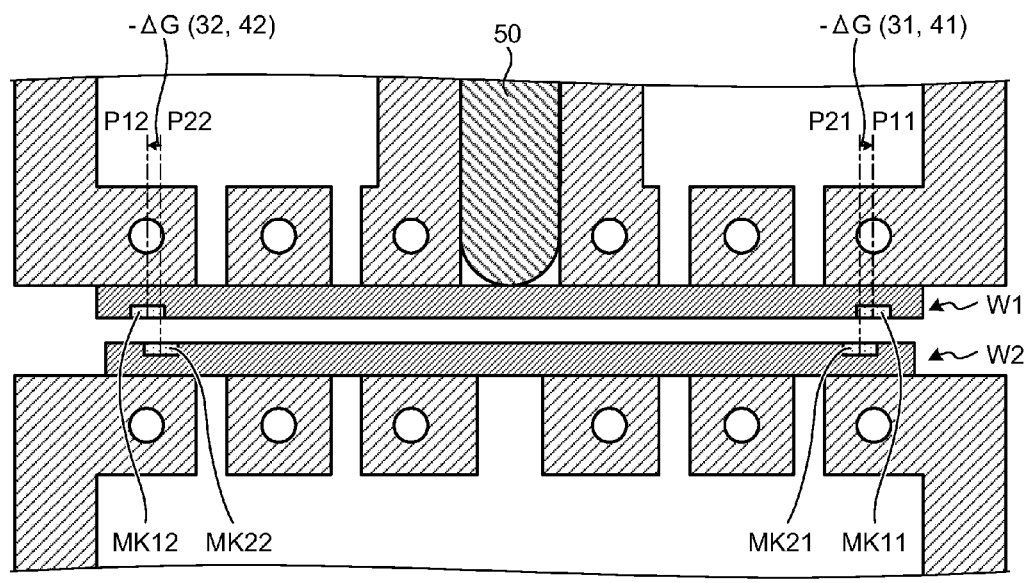
FIG. 7 illustrates the actual bonding according to an embodiment.

For example, the controller 60 produces the temperature difference between the upper substrate W1 and the lower substrate W2 so that the misalignment between the reference position of the upper substrate W1 and the reference position of the lower substrate W2 reaches the target value (see FIG. 7). This target value can be set to the amount that cancels the misalignment between the reference positions of the two substrates due to the deformation of the substrate at the bonding, i.e., the amount equivalent to the amount of misalignment between the reference positions of the two substrates in a direction opposite to the direction where the reference positions of the two substrates are misaligned. For example, the controller 60 can produce the temperature difference between the upper substrate W1 and the lower substrate W2 so as to produce the difference in thermal expansion amount between the upper substrate W1 and the lower substrate W2 corresponding to this target value. Thus, it is possible to cancel the misalignment between the reference positions of the two substrate due to the deformation of the substrate when the two substrates are bonded to each other, thereby improving the positioning accuracy for the bonding between the two substrates.

Moreover, for example, the controller 60 may produce the temperature difference between the upper substrate W1 and the lower substrate W2 so that the room temperature is included in the temperature range between (including the boundary between) the target temperature T1 and the target temperature T2. For example, the controller 60 may set the room temperature as the target temperature T1 or set the room temperature as the target temperature T2, and may set T1<room temperature<T2 or T2<room temperature<T1. This makes it possible to bond the two substrates to each other at the temperature close to the room temperature while the two substrates have the temperature difference.

For example, the controller 60 drives the pressing member 50 via a driving device 73 and a shaft 74 in a state where the substrate sucked on the suction stage 10 and the substrate sucked on the suction stage 20 are controlled to have the temperature difference. For example, in the state where the upper substrate W1 and the lower substrate W2 are controlled to have the temperature difference, the controller 60 has the pressing member (for example, pin) 50 mechanically press the central portion (for example, portion near the center CP1) MP1 on the non-bonding surface side of the upper substrate W1. Thus, the bonding start point of the upper substrate W1 with respect to the lower substrate W2 is formed in a manner that the upper substrate W1 is brought into contact with the lower substrate W2 while the upper substrate W1 is deformed so that the central portion of the upper substrate W1, which is on the inner side of the peripheral portion of the upper substrate W1, is projected toward the lower substrate W2 (see FIG. 8). Then, the bonding interface is expanded to the outer peripheral side spontaneously (see FIG. 9 and FIG. 10).

Figure 2:
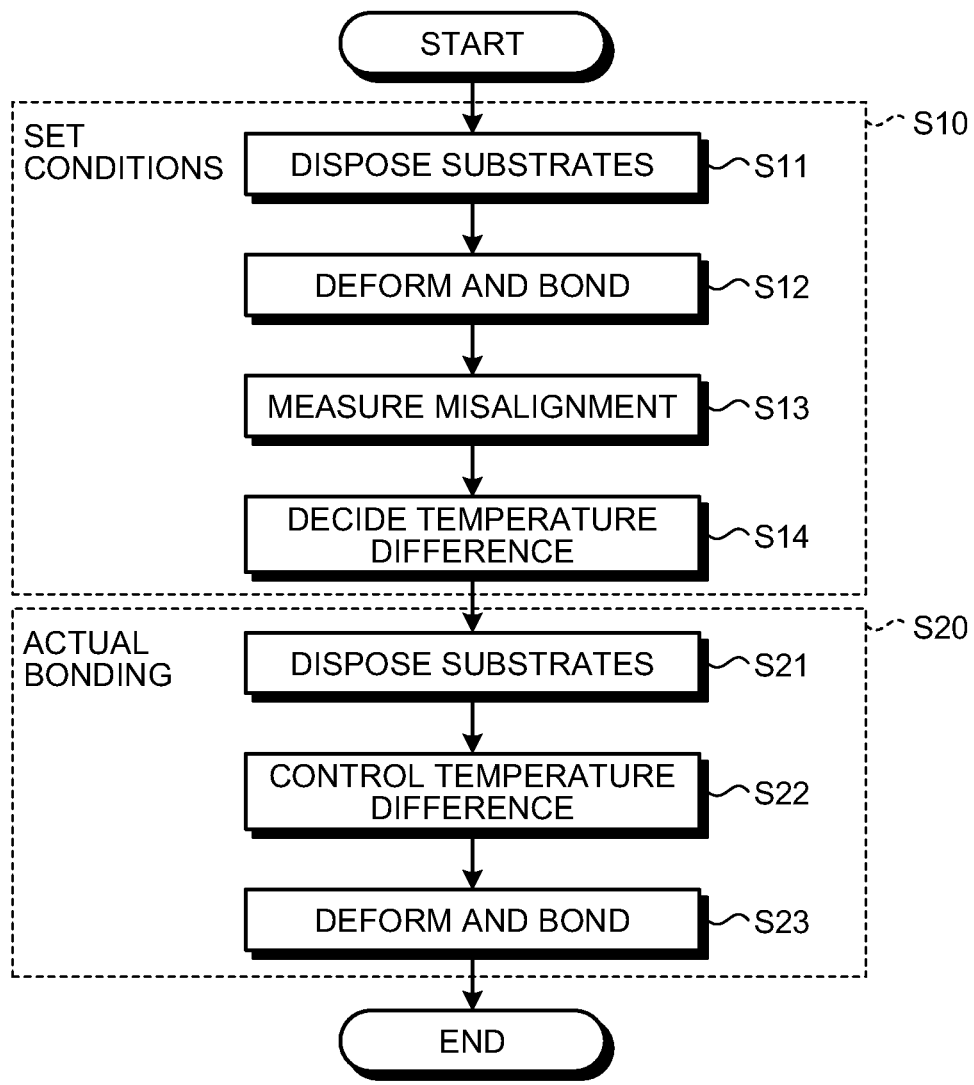
FIG. 2 is a flowchart illustrating a substrate bonding method according to an embodiment.

Next, the substrate bonding method according to this embodiment is described with reference to FIG. 2. FIG. 2 is a flowchart illustrating the substrate bonding method.

In Step S10, the controller 60 sets the condition for the substrate bonding. Note that in the case of bonding the two substrates by the expansion bonding method under the room temperature, the amount and the direction of the misalignment of the bonding position are affected by various factors including the shape, amount of pressing, material, and thickness of the substrate, the position, strength, and timing of stopping the suction, and the degree of projection of the substrate (radius of curvature of the projection in a sectional view). Thus, it is difficult to predict the amount and direction of the misalignment of the bonding position. Therefore, before the actual bonding (Step S20), the controller 60 evaluates the misalignment of the bonding position by performing preliminary bonding at a room temperature and sets the condition of the temperature difference to be employed in the actual bonding (Step S20) based on the evaluation results.

Figure 12:
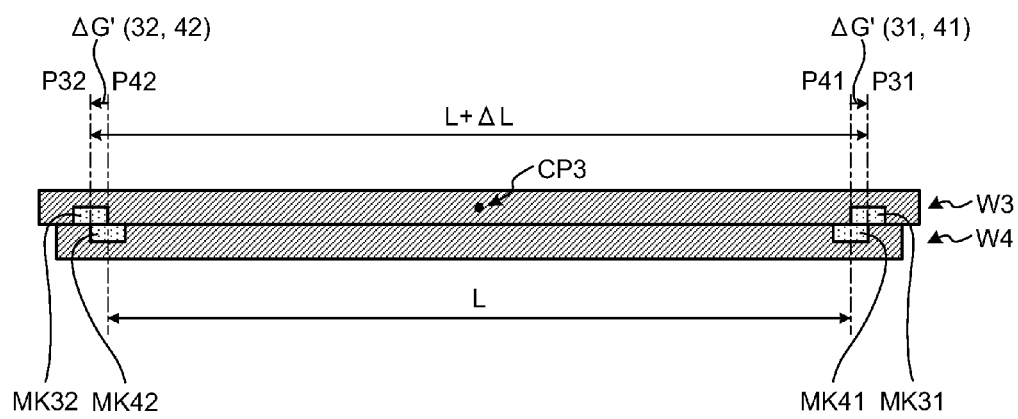
FIG. 12 is a diagram of setting the condition according to an embodiment (in the case where the upper substrate is misaligned with the lower substrate toward the outside of the lower substrate)

Specifically, the controller 60 performs the processes of Step S11 to S14 as illustrated in FIG. 3 to FIG. 6, FIG. 11, and FIG. 12. FIG. 3 to FIG. 6 illustrate the conditions in the case where the upper substrate is misaligned with the lower substrate toward the center of the lower substrate. FIG. 11 and FIG. 12 illustrate the conditions in the case where the upper substrate is misaligned with the lower substrate toward the outside of the lower substrate.

In Step S11 illustrated in FIG. 2, the controller 60 disposes a substrate W3 and a substrate W4 to face each other. The substrate W3 corresponds to the substrate W1 used in the actual bonding, and has, for example, the same shape, amount of pressing, material, and thickness as those of the substrate W1. The substrate W4 corresponds to the substrate W2 used in the actual bonding, and has, for example, the same shape, amount of pressing, material, and thickness as those of the substrate W2.

For example, the substrate W3 is sucked on the opposite surface 10a of the suction stage 10, and the substrate W4 is sucked on the opposite surface 20a of the suction stage 20. After that, as illustrated in FIG. 3, the controller 60 drives the suction stages 10 and 20 relatively in the X-Y direction so that alignment marks MK31, MK41, MK32, and MK42 of the both substrates W3 and W4 are aligned.

In Step S12 illustrated in FIG. 2, in the state where the substrate W3 and the substrate W4 have the room temperature, the controller 60 bonds the substrate W3 to the substrate W4 by bringing the substrate W3 into contact with the substrate W4 while deforming the substrate W3 so that the central portion MP3 of the substrate W3, which is on the inner side of the peripheral portion PP3 of the substrate W3, is projected toward the substrate W4.

For example, the controller 60 turns off the control of the temperature of the cooling medium passing through the suction stage 10 via the temperature control unit 30 and the control of the temperature of the cooling medium passing through the suction stage 20 via the temperature control unit 40. Thus, the controller 60 produces the state in which the substrate W3 and the substrate W4 have the room temperature. Note that the controller 60 may control the temperature of the cooling medium passing through the suction stage 10 to the room temperature via the temperature control unit 30 and the temperature of the cooling medium passing through the suction stage 20 to the room temperature via the temperature control unit 40.

For example, as illustrated in FIG. 4, the controller 60 has the pressing member 50 mechanically press the central portion MP3 (portion near the center CP3, for example) on the non-bonding surface side of the upper substrate W3, thereby deforming the central portion MP3 of the bonding surface side of the upper substrate W3 to project toward the substrate W4. Thus, the controller 60 brings the upper substrate W3 and the lower substrate W4 into contact with each other on the central portions MP3 and MP4 on the bonding surface side. As a result, the central portions MP3 and MP4 on the bonding surface are bonded to each other and the bonding start point is formed.

Next, the controller 60 sequentially stops the suction of the upper substrate W3 from the central portion MP3 of the substrate W3 toward the peripheral portion PP3 as illustrated in FIG. 5 and FIG. 11. Thus, the controller 60 expands the bonding reaction from the central portions MP3 and MP4 of the substrates W3 and W4 toward the peripheral portions PP3 and PP4. On this occasion, the projection of the upper substrate W3 easily causes the bonding misalignment at the peripheral portions PP3 and PP4 between the substrates W3 and W4.

For example, in the case of FIG. 5, the entire substrate W3 is pulled toward the center CP3, whereby the bonding position of the outer periphery of the substrate W3 is misaligned with the substrate W4 toward the center CP3 microscopically.

Alternatively, for example, as illustrated in FIG. 11, the entire substrate W4 is pulled outward and microscopically, the bonding position of the outer periphery of the substrate W3 is misaligned with the substrate W4 toward the outside of the substrate W4.

In view of this, in Step S13 illustrated in FIG. 2, the controller 60 measures the amount and direction of the misalignment of the bonding position between the substrate W3 and the substrate W4. In other words, the controller 60 measures the misalignment between the reference positions P31 and P32 of the substrate W3 and the reference positions P41 and P42 of the substrate W4.

Figure 6:
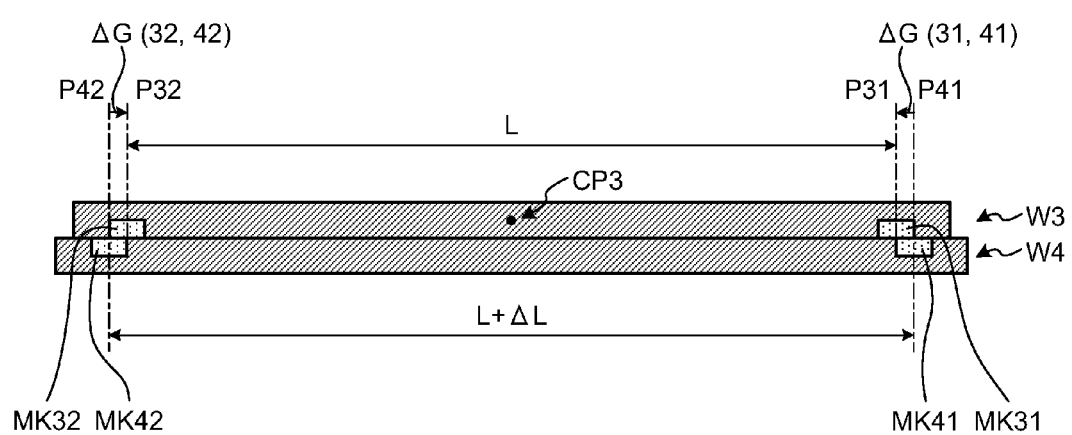
FIG. 6 is a diagram of setting the condition according to an embodiment (in the case where the upper substrate is misaligned with the lower substrate toward the center of the lower substrate)

For example, as illustrated in FIG. 6 and FIG. 12, the controller 60 photographs the alignment marks MK31 and MK32 of the substrate W3 and recognizes the center (for example, its center of gravity) between the alignment marks MK31 and MK32 as the reference positions P31 and P32 through image processing. Similarly, the controller 60 photographs the alignment marks MK41 and MK42 of the substrate W4 and recognizes the center between the alignment marks MK41 and MK42 as the reference positions P41 and P42 through image processing.

Then, as illustrated in FIG. 6, the controller 60 obtains the misalignment $\Delta G(31, 41)$ of the reference position P31 relative to the reference position P41 and the misalignment $\Delta G(32, 42)$ of the reference position P32 relative to the reference position P42. The misalignment $\Delta G(31, 41)$ and $\Delta G(32, 42)$ are used as the vector amount having the magnitude and the direction. For example, the misalignment $\Delta G(31, 41)$ has the direction approaching the center CP3 from the outside (leftward in FIG. 6). For example, the misalignment $\Delta G(32, 42)$ has the direction approaching the center CP3 from the outside (rightward in FIG. 6).

Alternatively, as illustrated in FIG. 12, the controller 60 obtains the misalignment $\Delta G'(31, 41)$ of the reference position P31 relative to the reference position P41 and the misalignment $\Delta G'(32, 42)$ of the reference position P32 relative to the reference position P42. The misalignment $\Delta G'(31, 41)$ and ΔG'(32, 42) are used as the vector amount having the magnitude and the direction. For example, the misalignment ΔG'(31, 41) has the direction going away from the center CP3 (rightward in FIG. 12). For example, the misalignment ΔG' (32, 42) has the direction going away from the center CP3 (leftward in FIG. 6).

In Step S14 illustrated in FIG. 2, the controller 60 obtains the temperature difference corresponding to the misalignment of the reference position measured in Step S13. For example, the controller 60 obtains the temperature difference that produces the difference in thermal expansion amount whose magnitude is equal to, and whose direction is the opposite to the misalignment of the reference position measured in Step S13.

For example, in the case where the measurement in Step S13 has indicated that the reference positions P31 and P32 of the substrate W3 are misaligned toward the center as compared with the reference positions P41 and P42 of the substrate W4 (see FIG. 6), the controller 60 decides the temperature difference between the substrate W1 and the substrate W2 in the actual bonding so that the substrate W1 has higher temperature than the substrate W2 (see FIG. 7).

For example, it is assumed that the thermal expansion coefficients of the substrate W3 and the substrate W4 are both α and the distance between the reference positions P31 and P32 (measurement distance) on opposite sides around the center CP3 of the substrate W3 is L. Here, Formulae 1 and 2 hold wherein each of the magnitude of the misalignment ΔG(31, 41) and the magnitude of the misalignment ΔG(32, 42) is ΔL/2, the target temperature of the substrate W1 is T1, and the target temperature of the substrate W2 is T2.

$$\Delta T = \Delta L/L/\alpha \quad \text{Formula 1}$$

$$T1 = T2 + \Delta T \quad \text{Formula 2}$$

The temperature difference ΔT of Formula 1 corresponds to the target value −ΔG(31, 41) of the misalignment between the reference position P11 of the substrate W1 and the reference position P21 of the substrate W2, and to the target value −ΔG(32, 42) of the misalignment between the reference position P12 of the substrate W1 and the reference position P22 of the substrate W2. In other words, the difference in thermal expansion amount between the substrate W1 and the substrate W2 for the temperature difference ΔT can make the misalignment between the reference position P11 of the substrate W1 and the reference position P21 of the substrate W2 reach the target value −ΔG(31, 41), and can make the misalignment between the reference position P12 of the substrate W1 and the reference position P22 of the substrate W2 reach the target value −ΔG(32, 42) (see FIG. 7). The target value −ΔG(31, 41) is equivalent in magnitude to, but directed opposite to the misalignment ΔG(31, 41) measured in Step S13. The target value −ΔG(32, 42) is equivalent in magnitude to, but directed opposite to the misalignment ΔG(32, 42) measured in Step S13.

For example, when $\alpha=2.6\times10^{-6}$, L=280 mm, and ΔL=0.001 mm are assigned to Formula 1, the difference in temperature of the substrate W1 from the substrate W2 is determined to ΔT=1.37° C. When the room temperature is 20° C. and the target temperature T2 of the substrate W2 is controlled to the room temperature (=20° C.), the target temperature T1 of the substrate W1 is T1=20° C.+1.37° C.=21.37° C.

Figure 13:
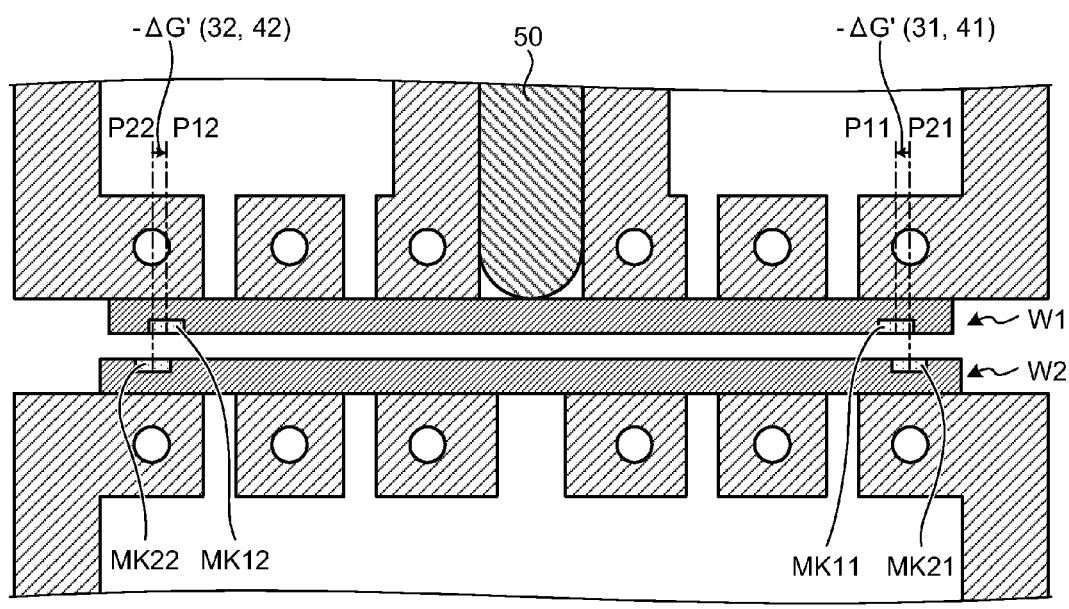
FIG. 13 illustrates the actual bonding according to an embodiment.

Alternatively, for example, in the case where the measurement in Step S13 has indicated that the reference positions P31 and P32 of the substrate W3 are misaligned outward as compared with the reference positions P41 and P42 of the substrate W4 (see FIG. 11), the controller 60 decides the temperature difference between the substrate W1 and the substrate W2 in the actual bonding so that the substrate W1 has lower temperature than the substrate W2 (see FIG. 13).

For example, it is assumed that the thermal expansion coefficients of the substrate W3 and the substrate W4 are both α and the distance between the reference positions P31 and P32 (measurement distance) on opposite sides around the center CP3 of the substrate W3 is L. Here, Formulae 3 and 4 hold wherein each of the magnitude of the misalignment ΔG'(31, 41) and the magnitude of the misalignment ΔG'(32, 42) is ΔL/2, the target temperature of the substrate W1 is T1, and the target temperature of the substrate W2 is T2.

$$\Delta T' = -\Delta L/L/\alpha \quad \text{Formula 3}$$

$$T1 = T2 + \Delta T' \quad \text{Formula 4}$$

The temperature difference ΔT' of Formula 3 corresponds to the target value −ΔG'(31, 41) of the misalignment between the reference position P11 of the substrate W1 and the reference position P21 of the substrate W2, and to the target value −ΔG'(32, 42) of the misalignment between the reference position P12 of the substrate W1 and the reference position P22 of the substrate W2. In other words, the difference in thermal expansion amount between the substrate W1 and the substrate W2 for the temperature difference ΔT' can make the misalignment between the reference position P11 of the substrate W1 and the reference position P21 of the substrate W2 reach the target value −ΔG'(31, 41), and can make the misalignment between the reference position P12 of the substrate W1 and the reference position P22 of the substrate W2 reach the target value −ΔG'(32, 42) (see FIG. 13). The target value −ΔG'(31, 41) is equivalent in magnitude to, but directed opposite to the misalignment ΔG(31, 41) measured in Step S13. The target value −ΔG'(32, 42) is equivalent in magnitude to, but directed opposite to the misalignment ΔG(32, 42) measured in Step S13.

For example, when $\alpha=2.6\times10^{-6}$, L=280 mm, and ΔL=0.001 mm are assigned to Formula 3, the difference in temperature of the substrate W1 from the substrate W2 is determined to ΔT=−1.37° C. When the room temperature is 20° C. and the target temperature T2 of the substrate W2 is controlled to the room temperature (=20° C.), the target temperature T1 of the substrate W1 is T1=20° C.−1.37° C.=18.63° C.

In Step S20 illustrated in FIG. 2, the controller 60 conducts the actual bonding of the substrates. That is, in the state where the temperature difference is produced between the two substrates as set in the condition decision (Step S10), the two substrates are bonded by the expansion bonding method.

Specifically, the controller 60 performs the processes in Steps S21 to S23 as illustrated in FIG. 7 to FIG. 10 and FIG. 13. FIG. 7 to FIG. 10 and FIG. 13 illustrate the actual bonding.

In Step S21 illustrated in FIG. 2, the controller 60 disposes the substrate W1 and the substrate W2 so as to face each other. For example, the substrate W1 is sucked on the opposite surface 10*a* of the suction stage 10 and the substrate W2 is sucked on the opposite surface 20*a* of the suction stage 20. After that, the controller 60 drives the suction stages 10 and 20 relatively in the X-Y direction so that the alignment marks MK11, MK21, MK12, and MK22 of the substrates W1 and W2 are aligned.

In Step S22 illustrated in FIG. 2, the controller 60 produces the temperature difference between the substrate W1 and the substrate W2. For example, the controller 60 produces the temperature difference as decided in Step S14 between the substrate W1 and the substrate W2.

For example, as illustrated in FIG. 7 and FIG. 13, the controller 60 controls the temperature of the cooling medium passing through the suction stage 10 to reach the target temperature T1 via the temperature control unit 30, and controls the temperature of the cooling medium passing through the suction stage 20 to reach the target temperature T2 (≠T1) via the temperature control unit 40. Thus, the controller 60 controls so that the substrate (for example, the substrate W1) sucked on the suction stage 10 and the substrate (for example, the substrate W2) sucked on the suction stage 20 have the temperature difference (=|T1−T2|).

For example, in the case where the measurement in Step S13 has indicated that the reference positions P31 and P32 of the substrate W3 are misaligned toward the center as compared with the reference positions P41 and P42 of the substrate W4 (see FIG. 6), the controller 60 decides the temperature difference between the substrate W1 and the substrate W2 so that the substrate W1 has higher temperature than the substrate W2 (see FIG. 7). Thus, for example, the difference in thermal expansion amount between the substrate W1 and the substrate W2 for the temperature difference ΔT of Formula 1 can make the misalignment between the reference position P11 of the substrate W1 and the reference position P21 of the substrate W2 reach the target value −ΔG(31, 41), and can make the misalignment between the reference position P12 of the substrate W1 and the reference position P22 of the substrate W2 reach the target value −ΔG(32, 42) (see FIG. 7). The target value −ΔG(31, 41) is equivalent in magnitude to, but directed opposite to the misalignment ΔG(31, 41) measured in Step S13. The target value −ΔG(32, 42) is equivalent in magnitude to, but directed opposite to the misalignment ΔG(32, 42) measured in Step S13.

Alternatively, for example, in the case where the measurement in Step S13 has indicated that the reference positions P31 and P32 of the substrate W3 are misaligned outward as compared with the reference positions P41 and P42 of the substrate W4 (see FIG. 11), the controller 60 decides the temperature difference between the substrate W1 and the substrate W2 so that the substrate W1 has lower temperature than the substrate W2 (see FIG. 13). Thus, for example, the difference in thermal expansion amount between the substrate W1 and the substrate W2 for the temperature difference ΔT' of Formula 3 can make the misalignment between the reference position P11 of the substrate W1 and the reference position P21 of the substrate W2 reach the target value −ΔG' (31, 41), and can make the misalignment between the reference position P12 of the substrate W1 and the reference position P22 of the substrate W2 reach the target value −ΔG' (32, 42) (see FIG. 13). The target value −ΔG'(31, 41) is equivalent in magnitude to, but directed opposite to the misalignment ΔG(31, 41) measured in Step S13. The target value −ΔG'(32, 42) is equivalent in magnitude to, but directed opposite to the misalignment ΔG(32, 42) measured in Step S13.

In Step S23 illustrated in FIG. 2, in the state that the substrate W1 and the substrate W2 have the temperature difference, the controller 60 brings the substrate W1 into contact with the substrate W2 while deforming the substrate W1 so that the central portion MP1, which is on the inner side of the peripheral portion PP1 of the substrate W1, is projected toward the substrate W2.

Figure 8:
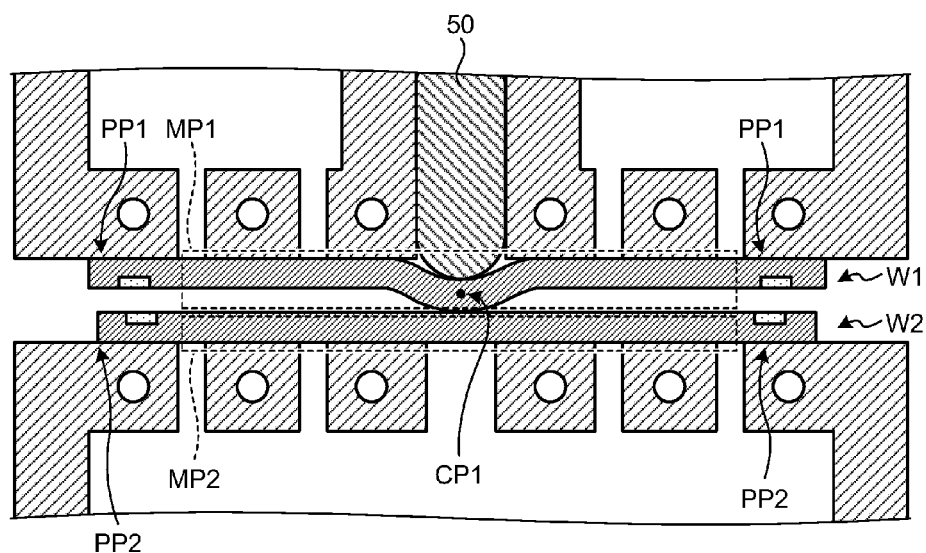
FIG. 8 illustrates the actual bonding according to an embodiment.

For example, as illustrated in FIG. 8, the controller 60 mechanically presses the central portion MP1 (portion near the center CP1, for example) on the non-bonding surface side of the upper substrate W1 via the pressing member 50, thereby projecting the central portion MP1 of the bonding surface side of the upper substrate W1 toward the substrate W2. Thus, the controller 60 brings the central portions MP1 and MP2 of the upper substrate W1 and the lower substrate W2 on the bonding surface side into contact with each other. Thus, first, a point on the central portions MP1 and MP2 on the bonding surface is bonded, thereby forming a bonding start point.

Figure 9:
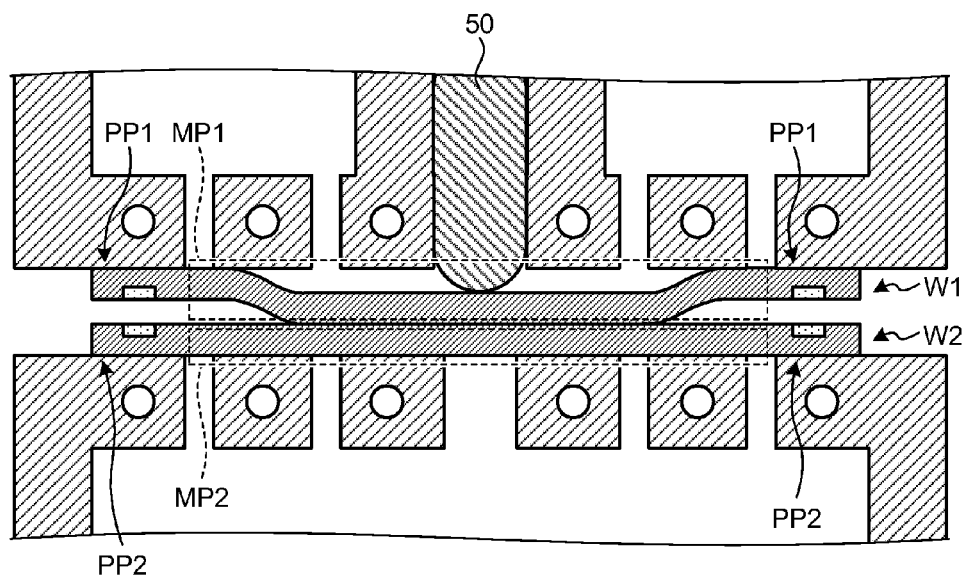
FIG. 9 illustrates the actual bonding according to an embodiment.
Figure 10:
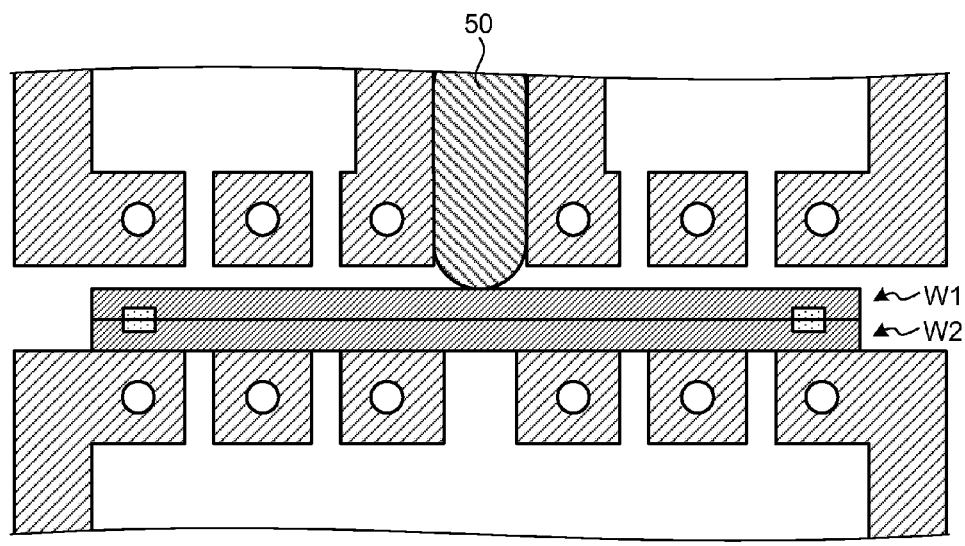
FIG. 10 illustrates the actual bonding according to an embodiment.

Next, as illustrated in FIG. 9 and FIG. 10, the controller 60 sequentially stops the suction of the upper substrate W1 from the central portion MP1 of the upper substrate W1 toward the peripheral portion PP1. Thus, the controller 60 expands the bonding reaction (bonding interface) from the central portions MP1 and MP2 of the substrates W1 and W2 toward the peripheral portions PP1 and PP2. On this occasion, even in the occurrence of the misalignment due to the projection of the upper substrate W3, the temperature difference between the substrates W1 and W2 produced before the bonding reaction can cancel the misalignment. Thus, even when the peripheral portion of the upper substrate W1 is misaligned with the lower substrate W2 during the bonding reaction, the bonding can be completed in the state where the substrates W1 and W2 are bonded to each other with smaller misalignment in the end, as illustrated in FIG. 10.

As described above, in this embodiment, the intentional temperature difference is produced between both substrates immediately before the bonding in the expansion bonding method. In other words, the substrate W1 and the substrate W2 are controlled to have the temperature difference. Then, in the state where the substrate W1 and the substrate W2 are controlled to have the temperature difference, the substrate W1 is bonded to the substrate W2 by bringing the substrate W1 into contact with the substrate W2 while the substrate W1 is deformed so that the central portion MP1 of the substrate W1, which is on the inner side of the peripheral portion PP1 of the substrate W1, is projected toward the substrate W2. Thus, the misalignment between the reference positions of the two substrates W1 and W2 due to the deformation of the substrate W1 at the bonding can be cancelled, and the boding with smaller misalignment of the substrate surfaces can be achieved. For example, the present embodiment is highly effective against the bonding misalignment of the substrate outer periphery toward the substrate center or substrate outer peripheral direction.

Therefore, the positioning accuracy for the bonding between the two semiconductor substrates can be improved, thereby increasing the manufacturing yield of the package of the plural semiconductor devices obtained by cutting and dividing the plural semiconductor substrates. For example, when the electricity is going to be conducted between the upper and lower chips stacked in the semiconductor device by the contact between the pad electrodes, the conduction can be assured between the upper and lower chips.

In this embodiment, in the expansion bonding method, the temperature of the substrate W1 is controlled to reach the target temperature T1 and the temperature of the substrate W2 is controlled to reach the target temperature T2, thereby producing the temperature difference between the substrate W1 and W2 (=|T1−T2|). Thus, the substrate W1 and the substrate W2 can stably have the temperature difference.

In this embodiment, in the expansion bonding method, the substrate W1 and the substrate W2 are controlled to stably have the temperature difference so that the room temperature is included in the temperature range between the target temperature T1 of the substrate W1 and the target temperature T2 of the substrate W2. For example, one of the target temperature T1 and the target temperature T2 can be set to the room temperature substantially. Thus, the two substrates can be bonded to each other at a temperature close to the room temperature while the two substrates have the temperature difference.

In this embodiment, in the expansion bonding method, the temperature difference is produced between the substrate W1 and the substrate W2 so that the misalignment between the reference positions P11 and P12 of the substrate W1 and the reference positions P21 and P22 of the substrate W2 reaches the target value. For example, the temperature difference can be produced between the substrate W1 and the substrate W2 so that the difference in thermal expansion amount between the substrate W1 and the substrate W2 reaches the target value. Thus, when the substrate W1 is bonded to the substrate W2, the misalignment of the reference positions of the two substrates W1 and W2 due to the deformation of the substrate W1 at the bonding can be cancelled.

In this embodiment, in the expansion bonding method, the misalignment of the bonding position is evaluated by conducting the preliminary bonding prior to the actual bonding (Step S20), and the condition for the temperature difference to be used in the actual bonding (Step S20) is obtained according to the evaluation result. In other words, in the state where the substrate W3 and the substrate W4 have the room temperature, the substrate W3 can be bonded to the substrate W4 by bringing the substrate W3 into contact with the substrate W4 while the substrate W3 is deformed so that the central portion MP3 of the substrate W3, which is on the inner side of the peripheral portion PP3 of the substrate W3, is projected toward the substrate W4. The misalignment between the reference positions P31 and P32 of the substrate W3 and the reference positions P41 and P42 of the substrate W4 is measured. Then, the temperature difference corresponding to the measured misalignment in reference position is decided. Thus, the temperature difference that can cancel the misalignment between the reference positions of the two substrates W1 and W2 due to the deformation of the substrate W1 at the bonding can be decided.

In this embodiment, in the expansion bonding method, when the temperature difference is decided, the temperature difference can be decided so that the thermal expansion amount is differentiated in a direction opposite to the misalignment of the reference position measured. For example, when the reference positions P31 and P32 of the substrate W3 are misaligned toward the center as compared with the reference positions P41 and P42 of the substrate W4, the temperature difference can be decided so that the temperature of the substrate W1 is higher than the temperature of the substrate W2. Alternatively, for example, when the reference positions P31 and P32 of the substrate W3 are misaligned outward as compared with the reference positions P41 and P42 of the substrate W4, the temperature difference can be decided so that the temperature of the substrate W1 is lower than the temperature of the substrate W2. Thus, the temperature difference that can cancel the misalignment between the reference positions of the two substrates W1 and W2 due to the deformation of the substrate W1 at the bonding can be decided.

In this embodiment, in the substrate bonding apparatus 1, the controller 60 controls the temperature control structures 35 and 45 so that the substrate W1 and the substrate W2 have the temperature difference. In the state where this control is maintained, the controller 60 controls the pressing member 50 so that the substrate W1 is bonded to the substrate W2 by bringing the substrate W1 into contact with the substrate W2 while deforming the substrate W1 in a manner that the central portion MP1 of the substrate W1, which is on the inner side of the peripheral portion PP1 of the substrate W1, is projected toward the substrate W2. Thus, the misalignment between the reference positions of the two substrates W1 and W2 due to the deformation of the substrate W1 at the bonding can be cancelled, thereby achieving the bonding with the smaller misalignment in the substrate surface.

In this embodiment, in the substrate bonding apparatus 1, the suction stage 10 has the plural suction holes 12-1 to 12-4 for sucking the substrate W1 to vacuum. The suction stage 20 has the plural suction holes 22-1 to 22-5 for sucking the substrate W2 to vacuum. The temperature control structure 35 has the cooling medium flow path 33 extending in the suction stage 10 avoiding the suction holes 12-1 to 12-4. The temperature control structure 45 has the cooling medium flow path 43 extending in the suction stage 20 avoiding the suction holes 22-1 to 22-5. The controller 60 controls the temperature of the substrate W1 by controlling the temperature of the first cooling medium flowing in the cooling medium flow path 33, and moreover controls the temperature of the substrate W2 by controlling the temperature of the second cooling medium flowing in the cooling medium flow path 43. Thus, the controller 60 can control the temperature control structures 35 and 45 so that the substrate W1 and the substrate W2 have the temperature difference.

Note that the temperature control structure 35 may be a Peltier element embedded in the suction stage 10 instead of the cooling medium flow path 33 extending in the suction stage 10. In this case, in the configuration of FIG. 1, the pump 31b is omitted in the temperature control unit 30, and the cooling medium control device 31 and the Peltier element are connected to each other with wires instead of the cooling medium pipe 32 and the cooling medium pipe 34. Within the suction stage 10, a surface of the Peltier element that is heated or cooled can be positioned on the opposite surface 10a side, or the surface of the Peltier element that is heated or cooled can be exposed as the opposite surface 10a. The heating/cooling unit 31a may control the Peltier element so that the temperature of the surface of the Peltier element that is heated or cooled reaches the target temperature by performing feedforward control using the experimentally predetermined parameters (for example, the amount of current or the direction of current to be fed to the Peltier element). Alternatively, the heating/cooling unit 31a may control the Peltier element so that the temperature of the surface of the Peltier element that is heated or cooled reaches the target temperature by performing feedback control while comparing the target temperature and the temperature of the surface of the Peltier element that is heated or cooled detected by a temperature sensor (not shown) embedded in the suction stage 10, for example.

Similarly, the temperature control structure 45 may be a Peltier element embedded in the suction stage 20 instead of the cooling medium flow path 43 extending in the suction stage 20. In this case, in the configuration of FIG. 1, the pump 41b is omitted in the temperature control unit 40 and the cooling medium control device 41 and the Peltier element are connected to each other with wires instead of the cooling medium pipe 42 and the cooling medium pipe 44. Within the suction stage 20, a surface of the Peltier element that is heated or cooled can be positioned on the opposite surface 20a side, or the surface of the Peltier element that is heated or cooled can be exposed as the opposite surface 20a. The heating/cooling unit 41a may control the Peltier element so that the temperature of the surface of the Peltier element that is heated or cooled reaches the target temperature by performing feedforward control using the experimentally predetermined parameters (for example, the amount of current or the direction of current to be fed to the Peltier element). Alternatively, the heating/cooling unit 41a may control the Peltier element so that the temperature of the surface of the Peltier element that is heated or cooled reaches the target temperature by performing feedback control while comparing the target temperature and the temperature of the surface of the Peltier element that is heated or cooled detected by a temperature sensor (not shown) embedded in the suction stage 20, for example.

When the substrate W1 is bonded to the substrate W2, the controller 60 may deform the substrate W1 so that a portion shifted from the center of the central portion of the substrate W1 is projected toward the substrate W2 instead of deforming the substrate W1 so that a portion near the center CP1 of the substrate W1 is projected toward the substrate W2. Even in this case, by performing the bonding in the state where the substrate W1 and the substrate W2 are controlled to have the temperature difference, the misalignment of the reference positions between the two substrates W1 and W2 due to the deformation of the substrate W1 at the bonding can be cancelled, thereby achieving the bonding with smaller misalignment in the substrate surface.

Moreover, the above embodiment has described the example in which the two substrates to be bonded to each other have the same size and shape at the room temperature; however, the two substrates to be bonded to each other may be different from each other in at least one of the size and shape. Even in this case, as long as the alignment mark is formed on each of the two substrates to be bonded to each other, the condition for bonding the substrates can be decided in a manner similar to Step S10 illustrated in FIG. 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate bonding method comprising:
disposing a first substrate and a second substrate to face each other;
controlling the first substrate and the second substrate to have a temperature difference; and
in a state where the first substrate and the second substrate are controlled to have the temperature difference, bonding the first substrate to the second substrate by bringing the first substrate into contact with the second substrate while deforming the first substrate so that a central portion of the first substrate is projected toward the second substrate, the central portion of the first substrate being on an inner side of a peripheral portion of the first substrate,
wherein the controlling to have the temperature difference includes producing the temperature difference between the first substrate and the second substrate to reach a predetermined temperature difference, so that a misalignment between a reference position of the first substrate and a reference position of the second substrate reaches a target value, and
wherein the predetermined temperature difference is decided in advance by:
disposing a third substrate corresponding to the first substrate and a fourth substrate corresponding to the second substrate, so that the third substrate and the fourth substrate face each other;
in the state where the third substrate and the fourth substrate are controlled to have a room temperature, bonding the third substrate to the fourth substrate by bringing the third substrate into contact with the fourth substrate while deforming the third substrate so that a central portion of the third substrate is projected toward the fourth substrate, the central portion of the third substrate being on an inner side of a peripheral portion of the third substrate;
measuring a misalignment between a reference position of the third substrate and a reference position of the fourth substrate; and
deciding a temperature difference corresponding to the measured misalignment between the reference positions,
wherein the controlling to have the temperature difference includes producing the temperature difference between the first substrate and the second substrate to reach the decided temperature difference.

2. The substrate bonding method according to claim 1, wherein the deciding the temperature difference includes deciding the temperature difference so that a difference in thermal expansion amount is generated in a direction opposite to the measured misalignment of the reference positions.

3. The substrate bonding method according to claim 1, wherein the deciding the temperature difference includes deciding the temperature difference so that, when the reference position of the third substrate is misaligned toward the center as compared with the reference position of the fourth substrate, a temperature of the first substrate is higher than a temperature of the second substrate.

4. The substrate bonding method according to claim 1, wherein the deciding the temperature difference includes deciding the temperature difference so that, when the reference position of the third substrate is misaligned outward as compared with the reference position of the fourth substrate, a temperature of the first substrate is lower than a temperature of the second substrate.

5. The substrate bonding method according to claim 1, wherein the bonding the first substrate to the second substrate includes deforming the first substrate so that a portion near a center of the first substrate is projected toward the second substrate.

6. The substrate bonding method according to claim 1, wherein the bonding the first substrate to the second substrate includes deforming the first substrate so that a portion shifted from a center of the central portion of the first substrate is projected toward the second substrate.

* * * * *